(12) United States Patent  
Endler et al.

(10) Patent No.: US 8,748,016 B2  
(45) Date of Patent: Jun. 10, 2014

(54) COATED BODIES MADE OF METAL, HARD METAL, CERMET, OR CERAMIC, AND METHOD(S) FOR COATING OF SUCH BODIES

(75) Inventors: Ingolf Endler, Coswig (DE); Mandy Hoehn, Dresden (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 267 days.

(21) Appl. No.: 13/505,553

(22) PCT Filed: Nov. 12, 2010

(86) PCT No.: PCT/EP2010/067371
§ 371 (c)(1), (2), (4) Date: May 2, 2012

(87) PCT Pub. No.: WO2011/058132
PCT Pub. Date: May 19, 2011

(65) Prior Publication Data
US 2012/0219789 A1 Aug. 30, 2012

(30) Foreign Application Priority Data
Nov. 12, 2009 (DE) .......................... 10 2009 046 667

(51) Int. Cl.
C23C 16/34 (2006.01)
C23C 16/36 (2006.01)

(52) U.S. Cl.
USPC ................. 428/697; 427/249.19; 427/255.39; 427/255.394; 428/325; 428/336; 428/698; 428/699

(58) Field of Classification Search
USPC ......... 427/249.19, 255.39, 255.394; 428/325, 428/336, 697, 698, 699
See application file for complete search history.

(56) References Cited

U.S. PATENT DOCUMENTS 6,395,379 B1   5/2002   Braendle
6,558,749 B2 * 5/2003   Braendle ....................... 427/450

(Continued)

FOREIGN PATENT DOCUMENTS

CA   2717187   *   9/2009
CA   2717188   *   9/2009

(Continued)

OTHER PUBLICATIONS

International Search Report of PCT/EP2010/067371, date of mailing Feb. 18, 2011.

(Continued)

*Primary Examiner* — Archene Turner
(74) *Attorney, Agent, or Firm* — Collard & Roe, P.C.

(57) ABSTRACT

The invention relates to coated bodies made of metal, hard metal, cermet or ceramic material, coated with a single- or multi-layer coating system containing at least one hard material composite coating, and to a method for coating such bodies. The aim of the invention is to develop a coating system for such bodies, which is single- or multi-layered and comprises at least one hard material composite coating, which contains cubic TiAlCN and hexagonal AlN as the main phases and is characterized by a composite structure having a smooth, homogeneous surface, high oxidation resistance and high hardness. The aim includes the development of a method for cost-effectively producing such coatings. The hard material composite coating according to the invention contains cubic TiAlCN and hexagonal AlN as main phases, wherein the cubic TiAlCN is microcrystalline fcc-$Ti_{1-x}Al_xC_yN_z$ where x>0.75, y=0 to 0.25 and z=0.75 to 1 having a crystallite size of $\geq$=0.1 μm, and wherein the composite coating in the grain boundary region additionally contains amorphous carbon having a percent by weight of 0.01% to 20%. The coating is carried out according to the invention in a LPCVD process at temperatures between 700° C. and 900° C. and at pressures between $10^2$ Pa and $10^5$ Pa without additional plasma excitation. The hard material composite coating according to the invention is characterized by a composite structure having a smooth, homogeneous surface, high oxidation resistance and high hardness and can be used in particular as a wear protection coating on $Si_3N_4$ and WC/Co indexable inserts and steel components.

12 Claims, 2 Drawing Sheets

Figure 1:
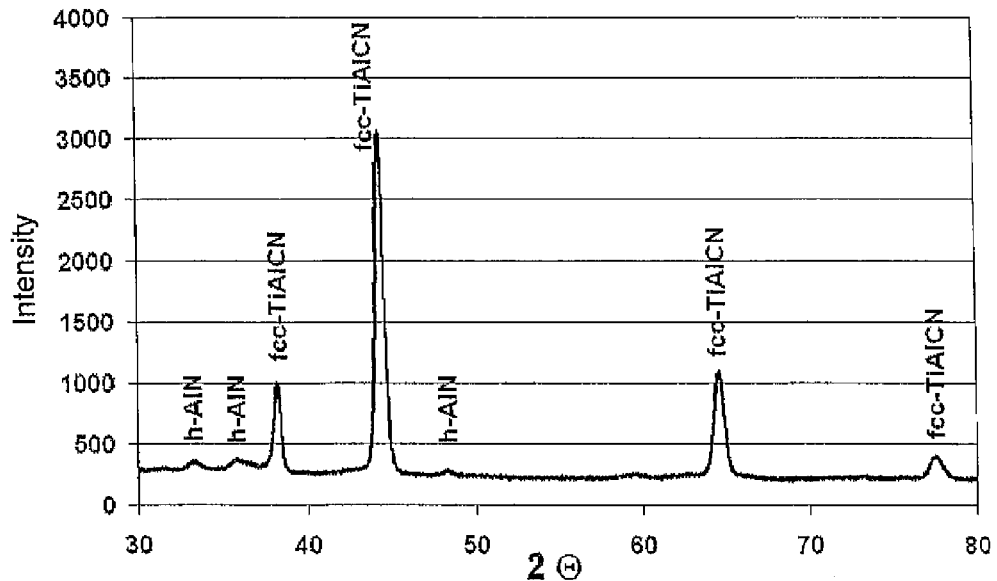

XRD diffractogram of the composite layer consisting of fcc-TiAlCN, h-AlN, and amorphous carbon, according to Exemplary Embodiment 1

(56) References Cited

U.S. PATENT DOCUMENTS

| | | |
|---|---|---|
| 7,767,320 B2 | 8/2010 | Endler |
| 2002/0136933 A1 | 9/2002 | Braendle |
| 2003/0143402 A1 | 7/2003 | Hon et al. |
| 2004/0115484 A1 | 6/2004 | Horling et al. |
| 2010/0233511 A1 | 9/2010 | Endler et al. |

FOREIGN PATENT DOCUMENTS

| | | | |
|---|---|---|---|
| CN | 101319302 | | 12/2008 |
| DE | 10 2005 032 860 | | 1/2007 |
| DE | 10 2007 000512 | | 1/2009 |
| EP | 1 574 594 | | 9/2005 |
| FR | 2 784 694 | | 4/2000 |
| JP | 05337705 | | 12/1993 |
| JP | 08-209333 | * | 8/1996 |
| WO | WO 98/10120 | | 3/1998 |
| WO | WO 03/085152 | | 10/2003 |
| WO | WO 2009/112117 | | 9/2009 |

OTHER PUBLICATIONS

K. Kawata et al., Thin Solid Films 390, Characterization of multilayer films of Ti—Al—O—C—N system prepared by pulsed d.c. plasma-enhanced chemical vapor deposition, (2001) pp. 64-69 (Spec., p. 2).

I. Endler et al., Surface & Coatings Technology 205, Aluminum-rich TiAlCN coatings by Low Pressure CVD, (2010) pp. 1307-1312 (ISR).

Shieh et al., J. Vac. Sci. Technol. A 20(1), Plasma-enhanced chemical-vapor deposition of titanium aluminum carbonitride/amorphous-carbon nanocomposite thin films, Jan./Feb. 2002, pp. 87-92 (Spec., p. 3).

* cited by examiner

XRD diffractogram of the composite layer consisting of fcc-TiAlCN, h-AlN, and amorphous carbon, according to Exemplary Embodiment 1

Raman spectrum of the composite layer consisting of fcc-TiAlCN, h-AlN, and amorphous carbon, according to Exemplary Embodiment 1

XRD diffractogram of the composite layer consisting of fcc-TiAlCN, h-AlN, and amorphous carbon, according to Exemplary Embodiment 2

COATED BODIES MADE OF METAL, HARD METAL, CERMET, OR CERAMIC, AND METHOD(S) FOR COATING OF SUCH BODIES

CROSS REFERENCE TO RELATED APPLICATIONS

This application is the National Stage of PCT/EP2010/067371 filed on Nov. 12, 2010, which claims priority under 35 U.S.C. §119 of German Application No. 10 2009 046 667.3 filed on Nov. 12, 2009, the disclosure of which is incorporated by reference. The international application under PCT article 21(2) was not published in English.

TECHNICAL FIELD

The invention relates to coated bodies made of metal, hard metal, cermet, or ceramic, coated with a single-layered or multi-layered layer system that contains at least one hard material composite layer, and method(s) for coating of such bodies. The hard material layer according to the invention produced on the bodies is characterized by a composite structure having a smooth, homogeneous surface, great oxidation resistance, and great hardness, and can particularly be used as a wear protection layer on $Si_3N_4$ and WC/Co indexable inserts and steel components.

STATE OF THE ART

Tools for chip-removing machining must meet high requirements with regard to useful lifetime and abrasion resistance. Coatings on the basis of nitrides, carbides, and carbonitrides of titanium have been used as wear protection layers for a long time. In recent years, the trend was to provide these coatings with greater oxidation resistance by means of incorporating aluminum.

TiAlN layers having a cubic NaCl structure and different methods for their production are known. In this connection, mono-phase fcc-TiAlN layers or mixtures of fcc-TiAlN and hexagonal AlN are produced using PVD, plasma-CVD or thermal CVD methods (WO 03/085152 A2; K. Kawata, H. Sugimura, O. Takai, Thin Solid Films, 390 (2001), p. 64-69; DE 10 2005 032 860 B4).

These layers are continuously improved further by means of the incorporation of carbon and of further metals, whereby both PVD and CVD methods are used.

Layer systems having pure fcc-TiAlCN layers are explained, for example, in CN 101319302A. In this connection, a method for PVD deposition of a linearly granulated TiAlCN layer is described, whereby the C/N gradient is produced by means of targeted metering of $N_2$ and $C_2H_2$.

The patent application WO 98/10120 A1 concerns itself with a PVD-coated work piece having at least two consecutive layers consisting of TiN, TiCN, TiAlN, and TiAlCN.

A work piece having a wear-reducing coating consisting of combined nitrides, carbonitrides, and carbides of Ti and Al is described in the patent US 2002/0136933 A1.

A coated cutting body having a layer consisting of Ti, Al, and N and/or C is patented in JP 05337705 A. This coating is produced by means of plasma CVD.

Coatings having a mixture of fcc-TiAlN and h-AlN (DE 10 2007 000 512 B3) as well as layers of a mixture of fcc-$(Ti_yAl_xMe_{1-x-y})N$ with h-AlN, whereby Me includes the metals Zr, Hf, V, Nb, Ta, Cr, Mo, W, or Si (US 2004/0115484 A1), are also known.

Nanocomposite layers consisting of fcc-TiAlCN and amorphous carbon are also known (US 2003/143402 Z1; J. Shieh and M. H. Hon, Plasma-enhanced chemical-vapor deposition of titanium aluminum carbonitrides/amorphous-carbon nanocomposite thin films, J. Vac. Sci. Technol., January/February 2002, A(20), (1), p. 87-92). These layers are produced by means of plasma CVD. The nanoscale TiAlCN grains are embedded in a matrix composed of amorphous carbon.

Furthermore, it is known to mix additional metals into fcc-TiAlN layers.

EP 1 574 594 A1 describes urea PVD layers that contain carbon, having a nanocrystalline structure having the composition $(Al_xMe1_yMe2_z)CuE1_vE2_w$ with: Me1 and Me2 metals x>0.4, x+y+z=1, and y, z≥0, as well as 1>u>0 and u=v=w=1, and v, w≥0. In this connection, the carbon content is greater in the grain boundaries than in the nanocrystals.

A hard-material-coated body having a CVD layer of $(Ti,Me)_{1-x}Al_x(C_yN_z)$ with Me–Zr and/or Hf is described in WO 2009/112117 A1. These layers are characterized by great oxidation resistance and great abrasion resistance.

PRESENTATION OF THE INVENTION

The invention is based on the task of developing a layer system for bodies made of metal, hard metal, cermet, or ceramic, which system is single-layered or multi-layered and has at least one hard material composite layer that contains cubic TiAlCN and hexagonal AlN as the main phases and is characterized by a composite structure having a smooth, homogeneous surface, great oxidation resistance, and great hardness. Included in this task is the development of a method for cost-advantageous production of such coatings.

This task is accomplished with the characteristics of the claims, whereby the invention also includes combinations of the individual dependent claims in the sense of an AND link.

The bodies coated according to the invention are characterized in that they are coated with a single-layered or multi-layered layer system that has at least one hard material composite layer that contains cubic TiAlCN and hexagonal AlN as the main phases, whereby the cubic TiAlCN is a microcrystalline fcc-$Ti_{1-x}Al_xC_yN_z$ with x>0.75, y=0 to 0.25, and z=0.75 to 1, with a crystallite size of ≥0.1 µm, and whereby this composite layer additionally contains carbon with a mass proportion of 0.01% to 20% in the grain boundary region.

The TiAlCN coating according to the invention is characterized by a microcrystalline composite structure, whereby the two main phases fcc-$Ti_{1-x}Al_xC_yN_z$ with x>0.75 and hexagonal AlN guarantee great hardness and oxidation resistance, and the amorphous carbon contributes to reducing the friction. The great hardness of the composite layer is maintained over a broad composition range, up to 50 mass-% h-AlN.

In contrast, TiAlCN nanocomposite layers according to the state of the art possess only limited oxidation resistance, because of the low aluminum content and the embedding of the TiAlCN crystals in amorphous carbon. The amorphous carbon matrix burns off starting from 400° C. Therefore cohesion in the nanocomposite layer no longer exists at high temperatures.

The TiAlCN layer according to the invention, in contrast, however, demonstrates surprisingly great oxidation resistance up to 800° C. The high aluminum content of the main components fcc-TiAlCN and hexagonal AlN as well as the microcrystalline structure are obviously the basis for the absorption of a specific amount of friction-reducing amorphous carbon, without any detrimental influence on the oxidation resistance.

The coating according to the invention can be provided with the following properties, in practical and advantageous manner:

Aside from the microcrystalline fcc-$Ti_{1-x}Al_xC_yN_z$, further Ti compounds can be contained in the hard material composite layer, which consist of $Ti_{1-x}Al_xN$ in the wurtzite structure and/or TiN.

The amorphous carbon is preferably present as graphitic $sp^2$ carbon.

According to the invention, the multi-layered layer system can consist of multiple TiAlCN hard material composite layers having different contents of amorphous carbon and/or hexagonal AlN.

The hard material composite layer can have a gradient with regard to the mass proportion of hexagonal AlN between 0.1% and 50%, and/or with regard to the mass proportion of amorphous carbon between 0.1% and 20%.

It is practical if the hard material composite layer according to the invention has a layer thickness between 0.1 µm and 30 µm.

The microcrystalline fcc-TiAlCN preferably possesses a crystallite size between 0.1 µm and 1 µm.

For the production of such coated bodies, the invention includes a method in which the bodies are provided with at least one hard material composite layer that has microcrystalline fcc-$Ti_{1-x}Al_xC_yN_z$ with x>0.75, y=0 to 0.25, and z=0.75 to 1, and hexagonal AlN, and additionally contains amorphous C with a mass proportion of 0.01% to 20%, whereby the composite layer is deposited onto the body using a gas mixture with Ti, Al, C, and N precursors, in an LPCVD process, at temperatures between 700° C. and 900° C., at pressures between $10^2$ Pa and $10^5$ Pa, without additional plasma excitation.

The method according to the invention can be configured in practical and advantageous manner, as follows:

It is advantageous to use titanium halogenides, aluminum halogenides, reactive nitrogen compounds, hydrocarbons and/or compounds with carbon and nitrogen as precursors for the deposition of the hard material composite layer.

It is advantageous to use $NH_3$ as reactive nitrogen compounds and $C_2H_4$ or $C_2H_2$ as hydrocarbons.

It is practical to mix $H_2$ and/or $N_2$ and/or noble gas into the gas mixture for deposition of the hard material composite layer.

EXAMPLES FOR IMPLEMENTATION OF THE INVENTION

Figure 2:
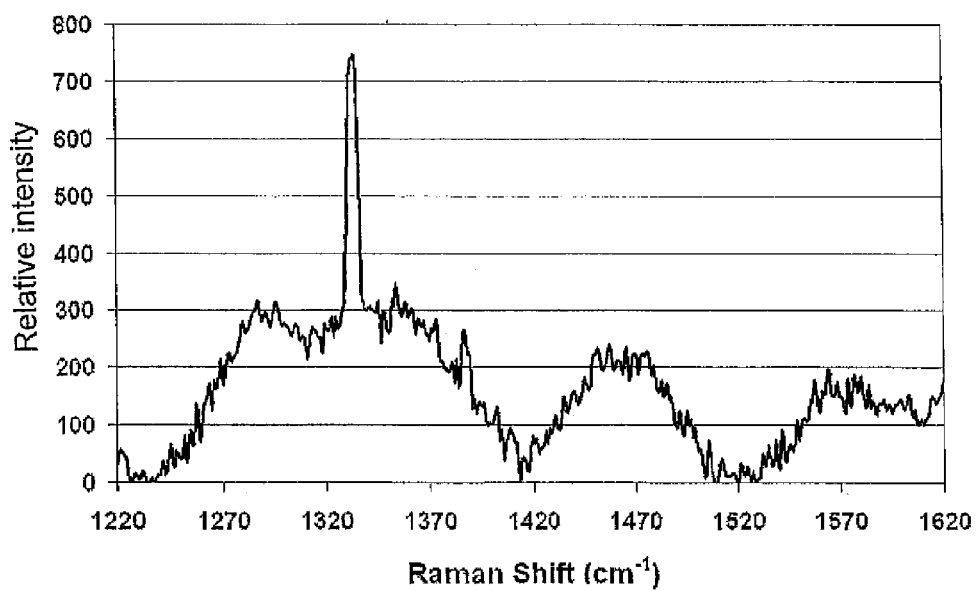
Figure 3:
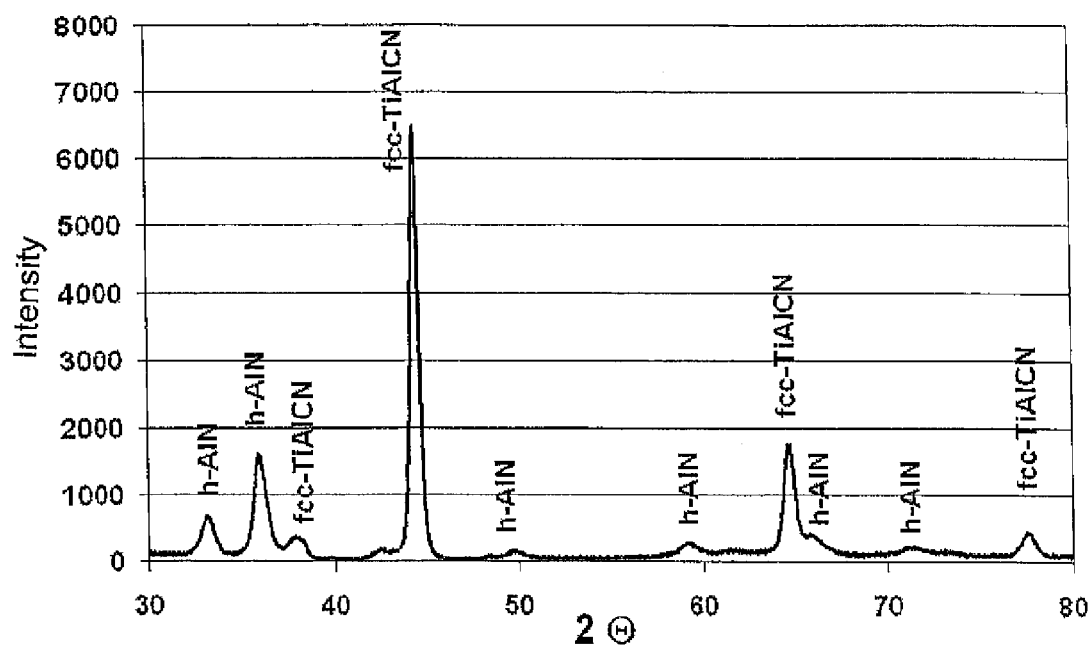

In the following, the invention is explained in greater detail using exemplary embodiments and the related figures. The figures show:

FIG. 1: the XRD diffractogram of the hard material composite layer according to Exemplary Embodiment 1, consisting of fcc-TiAlCN, h-AlN, and amorphous carbon, FIG. 2: the Raman spectrum of the hard material composite layer according to Exemplary Embodiment 1, consisting of fcc-TiAlCN, h-AlN, and amorphous carbon, FIG. 3: the XRD diffractogram of the hard material composite layer according to Exemplary Embodiment 2, consisting of fcc-TiAlCN, h-AlN, and amorphous carbon.

Example 1

First, a TiN bonding layer having a thickness of 1 µm is applied to WC/Co hard metal indexable inserts, and subsequently the layer according to the invention is applied by means of a CVD process.

The coating process takes place in a hot-wall CVD reactor having an inside diameter of 75 mm. A gas mixture that contains 51.8 vol.-% $H_2$, 1.3 vol.-% $AlCl_3$, 0.3 vol.-% $TiCl_4$, 25.9 vol.-% Ar, and 4.9 vol.-% $NH_3$, 1.3 vol.-% $C_2H_4$, as well as 14.5 vol.-% $N_2$, is used for the CVD coating. The deposition temperature amounts to 850° C., and the process pressure is 0.8 kPa. After a coating period of 30 min, a TiAlCN layer having a thickness of 5 µm is obtained.

By means of WDX examination, a C content of 0.5 at.-%, an aluminum content of 36.2 at.-%, a titanium content of 8.1 at.-%, a chlorine content of 0.3 at.-%, and a nitrogen content of 54.9 at.-% were determined within the layer.

This layer was examined by means of X-ray thin-layer analysis, with sweeping incidence (see X-ray diffractogram, FIG. 1). The diffractogram shows a phase mixture consisting of fcc-TiAlCN and h-AlN. A Rietveld analysis showed a content of 3.5 ma.-% h-AlN and 96.5 ma.-% fcc-TiAlCN for the crystalline layer components. Amorphous layer components cannot be determined using the X-ray examination methods.

For detection of the amorphous carbon, TEM and Raman examinations were conducted. The TEM examination showed carbon enrichment in the grain boundary region. The Raman spectrum (see FIG. 2) contains two broad bands, the first between 1200 and 1400 $cm^{-1}$, and the second between 1500 and 1700 $cm^{-1}$, which correspond to the D band and G band of an amorphous $sp^2$ carbon. The crystallite size determined in the TEM examination for the fcc-TiAlCN amounts to 0.4 µm.

Microhardness measurements using a Vickers indenter show a hardness of 31.5±0.6 GPa.

The hard material layer according to the invention is characterized by a composite structure having a smooth, homogeneous surface, great oxidation resistance, and great hardness.

Example 2

First, a TiN bonding layer having a thickness of 1 µm is applied to $Si_3N_4$ ceramic indexable inserts, and subsequently the layer according to the invention is applied by means of a CVD process.

The coating process takes place in a hot-wall CVD reactor having an inside diameter of 75 mm. A gas mixture that contains 51.7 vol.-% $H_2$, 1.2 vol.-% $AlCl_3$, 0.5 vol.-% $TiCl_4$, 25.9 vol.-% Ar, and 4.9 vol.-% $NH_3$, 1.3 vol.-% $C_2H_4$, as well as 14.5 vol.-% $N_2$, is used for the CVD coating. The deposition temperature amounts to 850° C., and the process pressure is 0.8 kPa. After a coating period of 25 min, a TiAlCN layer having a thickness of 5 µm is obtained.

By means of WDX examination, a C content of 0.6 at.-%, an aluminum content of 36.6 at.-%, a titanium content of 8.7 at.-%, a chlorine content of 0.3 at.-%, and a nitrogen content of 53.8 at.-% were determined within the layer.

This layer was examined by means of X-ray thin-layer analysis, with sweeping incidence (see X-ray diffractogram, FIG. 3). The diffractogram shows a phase mixture consisting of fcc-TiAlCN and h-AlN, with a higher proportion of AlN than in Example 1. A Rietveld analysis showed a content of 29.0 ma.-% h-AlN and 71.0 ma.-% fcc-TiAlCN for the crystalline layer components.

The Raman analysis yields an identical spectrum as in FIG. 2, with D and G bands for amorphous $sp^2$ carbon.

The analysis of the layer structure by means of raster electron microscope shows a rather fine-grained structure with a crystallite size of the fcc-TiAlCN of 0.1 µm.

The hardness measured with a Vickers indenter amounts to 30.3±0.5 GPa.

The hard material layer according to the invention is characterized by a very fine-grained composite structure having a smooth, homogeneous surface, excellent oxidation resistance, and great hardness.

The invention claimed is:

1. Coated bodies made of metal, hard metal, cermet, or ceramic, coated with a single-layered or multi-layered layer system that contains at least one hard material composite layer, which system contains cubic TiAlCN and hexagonal AlN as the main phases, wherein the cubic TiAlCN is a microcrystalline fcc-$Ti_{1-x}Al_xC_yN_z$ with x>0.75, y=0 to 0.25, and z–0.75 to 1, with a crystallite size of ≥0.1 µm, and wherein this composite layer additionally contains carbon with a mass proportion of 0.01% to 20% in the grain boundary region.

2. Coated bodies according to claim 1, wherein aside from the microcrystalline fcc-$Ti_{1-x}Al_xC_yN_z$, further Ti compounds are contained, which consist of $Ti_{1-x}Al_xN$ in the wurtzite structure and/or TiN.

3. Coated bodies according to claim 1, wherein the amorphous carbon is present as graphitic $sp^2$ carbon.

4. Coated bodies according to claim 1, wherein the multi-layered layer system consists of multiple TiAlCN hard material composite layers having different contents of amorphous carbon and/or hexagonal AlN.

5. Coated bodies according to claim 1, wherein the hard material composite layer has a gradient with regard to the mass proportion of hexagonal AlN between 0.1% and 50%, and/or with regard to the mass proportion of amorphous carbon between 0.1% and 20%.

6. Coated bodies according to claim 1, wherein the hard material composite layer has a layer thickness between 0.1 µm and 30 µm.

7. Coated bodies according to claim 1, wherein the crystallite size of the microcrystalline fcc-TiAlCN lies in the range of 0.1 µm to 1.0 µm.

8. Method for coating bodies made of metal, hard metal, cermet, or ceramic with a single-layered or multi-layered layer system that contains at least one hard material composite layer, which layer contains microcrystalline fcc-$Ti_{1-x}Al_xC_yN_z$ with x>0.75, y=0 to 0.25, and z–0.75 to 1, and hexagonal AlN, as the main phases, and additionally contains amorphous carbon with a mass proportion of 0.01% to 20%, wherein the composite layer is deposited onto the body using a gas mixture with Ti, Al, C, and N precursors, in an LPCVD process, at temperatures between 700° C. and 900° C., at pressures between $10^2$ Pa and $10^5$ Pa, without additional plasma excitation.

9. Method according to claim 8, wherein titanium halogenides, aluminum halogenides, reactive nitrogen compounds, hydrocarbons and/or compounds with carbon and nitrogen are used as precursors for the deposition of the hard material composite layer.

10. Method according to claim 9, wherein $NH_3$ is used as a reactive nitrogen compound and $C_2H_4$ or $C_2H_2$ are used as hydrocarbons.

11. Method according to claim 8, wherein $H_2$ and/or $N_2$ are mixed into the gas mixture for deposition of the hard material composite layer.

12. Method according to claim 8, wherein inert noble gas is mixed into the gas mixture for deposition of the hard material composite layer.

* * * * *